(12) United States Patent
Jin et al.

(10) Patent No.: US 12,176,448 B2
(45) Date of Patent: Dec. 24, 2024

(54) PHOTOVOLTAIC CELL AND PHOTOVOLTAIC MODULE (71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Bo Zhang, Zhejiang (CN); Bike Zhang, Zhejiang (CN); Guangming Liao, Zhejiang (CN); Lin'an Zhang, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/061,401

(22) Filed: Dec. 2, 2022

(65) Prior Publication Data

US 2024/0105873 A1 Mar. 28, 2024

(30) Foreign Application Priority Data

Sep. 28, 2022 (CN) .......................... 202211193991.0

(51) Int. Cl.
*H01L 31/068* (2012.01)
*H01L 31/0224* (2006.01)
*H01L 31/028* (2006.01)

(52) U.S. Cl.
CPC .... *H01L 31/068* (2013.01); *H01L 31/022425* (2013.01); *H01L 31/028* (2013.01)

(58) Field of Classification Search
None
See application file for complete search history.

(56) References Cited

U.S. PATENT DOCUMENTS 6,114,046 A 9/2000 Hanoka
11,450,777 B1 9/2022 Qiu et al.
(Continued)

FOREIGN PATENT DOCUMENTS

CN 108666393 A 10/2018
CN 110690297 A 1/2020
(Continued)

OTHER PUBLICATIONS

Zhejiang Jinko Solar Co. Ltd., et al., Extended European Search Report, EP 22212300.2, Sep. 22, 2023, 4 pgs.
(Continued)

*Primary Examiner* — Tamir Ayad
(74) *Attorney, Agent, or Firm* — USCH Law, PC (57) ABSTRACT

A photovoltaic cell is provided, including a substrate, a doped layer, a tunneling dielectric layer, doped conductive layers, first electrodes, and conductive transport layers. A doping concentration of the doped layer is greater than that of the substrate. The doped layer includes first doped regions, second doped regions and third doped regions. A doping concentration of each first doped region is less than that of each second doped region and that of each third doped region. The tunneling dielectric layer is disposed on the first and second doped regions. Each doped conductive layer is aligned with a first doped region and is disposed on a tunneling dielectric layer. Each first electrode is disposed on and electrically connected to the doped conductive layer. Each conductive transport layer is aligned with a second doped region and is disposed on the tunneling dielectric layer.

19 Claims, 6 Drawing Sheets (56) References Cited

U.S. PATENT DOCUMENTS

| | | |
|---|---|---|
| 2009/0146239 A1 | 6/2009 | Miyachi et al. |
| 2012/0235268 A1* | 9/2012 | Niira .................... H01L 31/048 |
| | | 257/E31.127 |
| 2013/0087194 A1 | 4/2013 | Jang et al. |
| 2020/0287066 A1 | 9/2020 | Stodolny et al. |

FOREIGN PATENT DOCUMENTS

| | | | |
|---|---|---|---|
| CN | 210272384 U | 4/2020 | |
| CN | 210897294 U | 6/2020 | |
| CN | 112259621 A | 1/2021 | |
| CN | 112349798 A | 2/2021 | |
| CN | 112466961 A | 3/2021 | |
| CN | 112466962 A | 3/2021 | |
| CN | 112635592 A | 4/2021 | |
| CN | 113299770 A * | 8/2021 | ....... H01L 31/02167 |
| CN | 113471321 A | 10/2021 | |
| CN | 113571604 A | 10/2021 | |
| CN | 214336723 U | 10/2021 | |
| CN | 214477490 U | 10/2021 | |
| CN | 115101619 A | 9/2022 | |
| EP | 4002493 A1 | 5/2022 | |
| EP | 4195301 A1 | 6/2023 | |
| GB | 2509097 A | 6/2014 | |
| JP | H11274538 A | 10/1999 | |
| JP | 2010262979 A | 11/2010 | |
| JP | 2016103642 A | 6/2016 | |
| JP | 2016119346 A | 6/2016 | |
| JP | 2019117963 A | 7/2019 | |
| JP | 2019179838 A | 10/2019 | |
| JP | 2022081367 A | 5/2022 | |
| JP | 7284865 B1 | 5/2023 | |
| KR | 20120096178 A | 8/2012 | |
| KR | 20160097926 A | 8/2016 | |
| KR | 101740523 B1 | 5/2017 | |
| WO | 2011065571 A1 | 6/2011 | |

OTHER PUBLICATIONS

Zhejiang Jinko Solar Co. Ltd., et al., Examination report No. 1 for your standard patent application, AU 2022283790, Oct. 20, 2023, 6 pgs.

Zhejiang Jinko Solar Co. Ltd., et al., Extended European Search Report, EP 23154994.0, Nov. 27, 2023, 10 pgs.

Zhejiang Jinko Solar Co., Ltd et al., JP Decision to Grant a Patent with English translation, JP 2022-212228, Apr. 20, 2023, 5 pgs.

Zhejiang Jinko Solar Co., Ltd., et al., Notice of Reasons for Refusal with English translation, JP 2023-018906, Dec. 26, 2023, 12 pgs.

Zhejiang Jinko Solar Co., Ltd., et al., Communication pursuant to Article 94(3) EPC, EP 23154994.0, Apr. 25, 2024, 6 pgs.

Zhejiang Jinko Solar Co., Ltd., et al., JP First Office Action with English translation, JP 2023-082696, Jan. 26, 2024, 8 pgs.

Zhejiang Jinko Solar Co., Ltd., et al., KR Notice of Allowance with English translation, KR 10-2023-0093424, Aug. 30, 2024, 9 pgs.

Zhejiang Jinko Solar Co., Ltd., et al., Non-Final Rejection, U.S. Appl. No. 18/163,871, Sep. 6, 2024, 50 pgs.

* cited by examiner

PHOTOVOLTAIC CELL AND PHOTOVOLTAIC MODULE

CROSS-REFERENCE TO RELATED APPLICATION

The present application claims the benefit of priority under the Paris Convention to Chinese Patent Application No. 202211193991.0 filed on Sep. 28, 2022, which is incorporated herein by reference in its entirety.

TECHNICAL FIELD

Embodiments of the present disclosure relate in general to photovoltaic technology, and more particularly to a photovoltaic cell and a photovoltaic module.

BACKGROUND

Factors affecting the performance of photovoltaic cells (e.g., photoelectric conversion efficiency) include optical loss and electrical loss. The optical loss includes reflection loss of a front surface of the cell, shadow loss of contacted grid lines, non-absorption loss of long-wavelength light, and the like. The electrical loss includes loss of photogenerated carrier recombination on a surface of a semiconductor and inside the semiconductor, loss of contact resistance between the semiconductor and metal grid lines, loss of contact resistance between the metal and the semiconductor, and the like.

In order to reduce the electrical and optical losses of the photovoltaic cells, the rear surface of the photovoltaic cell generally needs to be polished. The rear surface polishing process mainly uses a wet chemical method to polish a rear boron-doped pyramid pile structure, which increases internal reflection of light, reduces a recombination rate of carriers on the surface, and improves the photoelectric conversion efficiency of the cell. In the rear surface polishing process, a morphology of a polished rear surface of a silicon crystal cell is conducive to rear reflection of long-wavelength light and uniformity of subsequent film layers formed on the rear surface, which plays an important role in improving the efficiency of the photovoltaic cells. The rear surface polishing process improves the performance of the photovoltaic cells, but there are still many factors affecting the performance of this type of photovoltaic cells. It is of great significance to develop high-efficiency passivated contact photovoltaic cells.

SUMMARY

Some embodiments of the present disclosure provide a photovoltaic cell and a photovoltaic module, which are at least conducive to improving photoelectric conversion efficiency of the photovoltaic cell.

Some embodiments of the present disclosure provide a photovoltaic cell including: a substrate; a doped layer disposed in a portion of the substrate adjacent to a first surface of the substrate, where a doping element type of the doped layer is the same as a doping element type of the substrate, and a doping concentration of the doped layer is greater than a doping concentration of the substrate, where the doped layer includes a plurality of first doped regions arranged at intervals along a first direction, a plurality of second doped regions disposed between respective two adjacent first doped regions and a plurality of third doped regions disposed between the respective two adjacent first doped regions, and where a doping concentration of each of the plurality of first doped regions is less than a doping concentration of any of the plurality of second doped regions and less than a doping concentration of any of the plurality of third doped regions; at least one tunneling dielectric layer disposed on the plurality of first doped regions and the plurality of second doped regions; a plurality of doped conductive layers arranged at intervals along the first direction, where each of the plurality of doped conductive layers is aligned with a respective first doped region and is disposed on a respective tunneling dielectric layer; a plurality of first electrodes arranged at intervals along the first direction, where the plurality of first electrodes extend in a second direction, each of the plurality of first electrodes is disposed on a side of a respective doped conductive layer away from the substrate and electrically connected to the respective doped conductive layer; and a plurality of conductive transport layers each aligned with a respective second doped region, where the plurality of conductive transport layers are disposed on the at least one tunneling dielectric layer, and each of the plurality of conductive transport layers is disposed between respective two adjacent doped conductive layers and is in contact with side walls of the respective two adjacent doped conductive layer.

In some embodiments, a doping concentration of each of the plurality of second doping regions is less than or equal to a doping concentration of each of the plurality of third doping regions.

In some embodiments, a doping depth of each of the plurality of first doped regions is less than a doping depth of each of the plurality of second doped regions in a direction perpendicular to the first surface.

In some embodiments, a doping depth of each of the plurality of second doping regions is less than or equal to a doping depth of each of the plurality of third doping regions in a direction perpendicular to the first surface.

In some embodiments, a doping depth of each of the plurality of first doped regions is in a range of 30 nm to 300 nm, a doping depth of each of the plurality of second doping regions is in a range of 50 nm to 500 nm, and a doping depth of each of the plurality of third doping regions is in a range of 200 nm to 1500 nm.

In some embodiments, the doping concentration of each of the plurality of first doped regions is in a range of $5E19$ $cm^{-3}$ to $1E21$ $cm^{-3}$, the doping concentration of each of the plurality of second doped regions is in a range of $1E20$ $cm^{-3}$ to $3E21$ $cm^{-3}$, and the doping concentration of each of the plurality of third doped regions is in a range of $5E17$ $cm^{-3}$ to $1E20$ $cm^{-3}$.

In some embodiments, a total doping amount of the plurality of first doped regions is less than a total doping amount of the plurality of second doped regions and less than a total doping amount of the plurality of third doped regions.

In some embodiments, a doping element type of each of the plurality of doped conductive layers is the same as the doping element type of the doped layer, and the doping concentration of the doped layer is less than a doping concentration of each of the plurality of doped conductive layers.

In some embodiments, a doping element type of each of the plurality of conductive transport layers is the same as the doping element type of the doped layer.

In some embodiments, a doping concentration of each of the plurality of conductive transport layers is greater than the doping concentration of the doped layer.

In some embodiments, each of the plurality of conductive transport layers includes body portions arranged at intervals along the first direction and a connection portion between the body portions, where the body portions are in contact with side walls of the respective two adjacent doped conductive layers, and a doping concentration of each of the body portions is less than or equal to a doping concentration of the connection portion.

In some embodiments, each of the plurality of second doping regions includes first sub-doping portions and a second sub-doping portion, where each of the first sub-doping portions is aligned with a respective body portion, the second sub-doping portion is aligned with the connection portion, and a doping concentration of each of the first sub-doping portions is less than or equal to a doping concentration of the second sub-doping portion.

In some embodiments, a doping depth of each of the first sub-doping portions is less than or equal to a doping depth of the second sub-doping portion in a direction perpendicular to the first surface.

In some embodiments, a ratio of a total area of connection portions in the plurality of conductive transport layers to a total area of the plurality of conductive transport layers is in a range of 1:11 to 2:3.

In some embodiments, a material of the doped layer includes at least one of single crystal silicon, microcrystal silicon, amorphous silicon and polysilicon.

In some embodiments, the material of the doped layer is the same as at least one of a material of the substrate, a material of each of the plurality of doped conductive layers, and a material of each of the plurality of conductive transport layers.

In some embodiments, the photovoltaic cell further includes a passivation layer disposed on the plurality of doped conductive layers, the plurality of conductive transport layers, and the plurality of third doped regions.

In some embodiments, the photovoltaic cell further includes a plurality of second electrodes arranged at intervals along the second direction, where the plurality of second electrodes extend along the first direction and electrically connected to the plurality of first electrodes arranged at intervals along the first direction.

In some embodiments, at least one conductive transport layer is disposed between two adjacent the second electrodes, and the photovoltaic cell further includes a plurality of conductive connection layers each disposed between a respective conductive transport layer and a respective second electrode, opposite side walls of each of the plurality of conductive connection layers are respectively in contact with a side wall of the respective conductive transport layer and a side wall of the respective second electrode.

In some embodiments, the doped layer further includes a plurality of fourth doped regions each aligned with a respective conductive connection layer, and a doping concentration of each of the plurality of fourth doped regions is greater than or equal to a doping concentration of each of the plurality of first doped regions and less than or equal to a doping concentration of each of the plurality of third doped regions.

Some embodiments of the present disclosure provide a photovoltaic module including: at least one cell string, each of the at least one cell string formed by a plurality of photovoltaic cells according to the above embodiments which are electrically connected; at least one encapsulation layer, each of the at least one encapsulation layer configured to cover a surface of a respective cell string; and at least one cover plate, each of the at least one cover plate configured to cover a surface of a respective encapsulation layer facing away from the respective cell string.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated. In order to more clearly describe embodiments of the present disclosure or technical solutions in conventional technologies, the accompanying drawings required to be used in the embodiments are briefly described below. Apparently, the accompanying drawings in the following description are merely related to some embodiments of the present disclosure, and those of ordinary skill in the art may obtain other drawings from these drawings without creative efforts.

DETAILED DESCRIPTION OF THE EMBODIMENTS

It is seen from BACKGROUND that, generally, conventional photovoltaic cells have low photoelectric conversion efficiency.

It is found that reasons for the low photoelectric conversion efficiency of the conventional photovoltaic cells are at least the following. In order to improve the photoelectric conversion efficiency of the photovoltaic cell, a doping concentration of a substrate is usually increased to improve a transporting rate of most of carriers in the substrate. However, a doping conductive layer with a larger doping concentration is generally provided in a region of the substrate where the electrode is directly facing. When both the doping concentration of the substrate and the doping concentration of the doping conductive layer are large, a band gap of a portion of the substrate in the region where the electrode is directly facing may decrease, resulting in reduction of an open-circuit voltage of the photovoltaic cell, which may cause decay of the electric field. Moreover, a high doping effect may occur in the large doping concentration, and a dark current may occur or a composite current due to a tunneling effect of most carriers may occur, thereby reducing the short-circuit current.

Embodiments of the present disclosure provides a photovoltaic cell, a doped layer is disposed on a first surface of a substrate, and the doped layer includes a plurality of first doped regions, a plurality of second doped regions and a plurality of third doped regions. A respective doped conductive layer and a respective first electrode are disposed in each first doped region, a respective conductive transport layer is disposed in each second doped region, and no first electrode and doped conductive layer is disposed in each third doped region. In order to improve the contact between the doped conductive layers and the first electrodes, the doped conductive layers are usually configured to be highly doped. In the embodiments of the present disclosure, the doping concentration of each first doped region is less than the doping concentration of each second doped region and less than the doping concentration of each third doped region. On the one hand, the decrease of the band gap of the substrate due to the excessive concentration of the doping elements below the first electrode is avoided, so that the reduction of the open-circuit voltage of the photovoltaic cell and the decay of the electric field are avoided. On the other hand, a high doping effect (e.g., a tunneling effect produces a composite current) caused by an excessive doping concentration of the doped conductive layers and the excessive doping concentration of the doped layer is avoided. However, by providing the plurality of second doping regions and the plurality of third doping regions with large doping concentrations, the carrier transporting efficiency in the region unaligned with the first electrodes is improved, so that the open-circuit voltage of the photovoltaic cell is increased, which is conducive to improving the photoelectric conversion efficiency of the photovoltaic cell.

In addition, the doping concentration of the doped layer is greater than the doping concentration of the substrate, and a high-low junction is formed between the doped layer and the substrate, so that a built-in electric field is formed between the doped layer and the substrate, positive space charges are formed on the surface of the doped layer with the greater doping concentration, and negative space charges are formed on the surface of the substrate with the less doping concentration, thereby most carriers in the substrate are easily drift to the doped layer with the greater doping concentration, which is conducive to increasing an output current of the photovoltaic cell. Meanwhile, due to the existence of the built-in electric field, there is a potential barrier between the substrate and the doped layer, thus blocking the drift of majority carriers in the doped layer with the greater doping concentration to the substrate with the less doping concentration.

Various embodiments of the present disclosure are described in detail below with reference to the accompanying drawings. Those of ordinary skill in the art should appreciate that many technical details have been proposed in various embodiments of the present disclosure for the better understanding of the present disclosure. However, the technical solutions claimed in the present disclosure are able to be realized even without these technical details and various changes and modifications based on the following embodiments.

Figure 1:
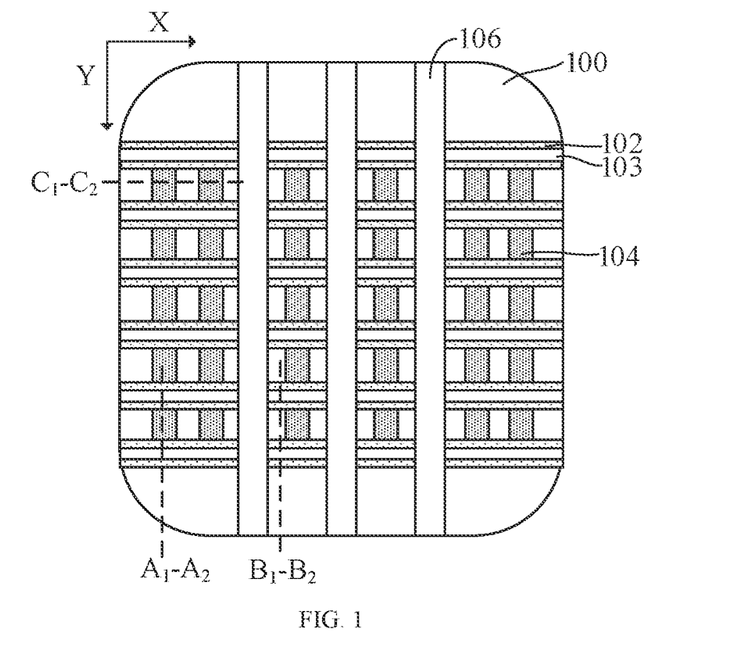
FIG. 1 is a schematic structural diagram of a photovoltaic cell according to an embodiment of the present disclosure.
Figure 2:
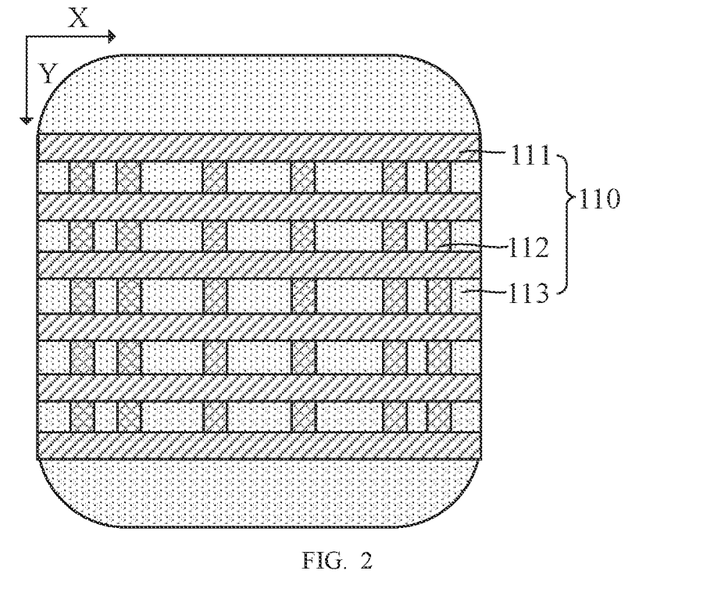
FIG. 2 is a schematic structural diagram of a doped layer in a photovoltaic cell according to an embodiment of the present disclosure.
Figure 3:
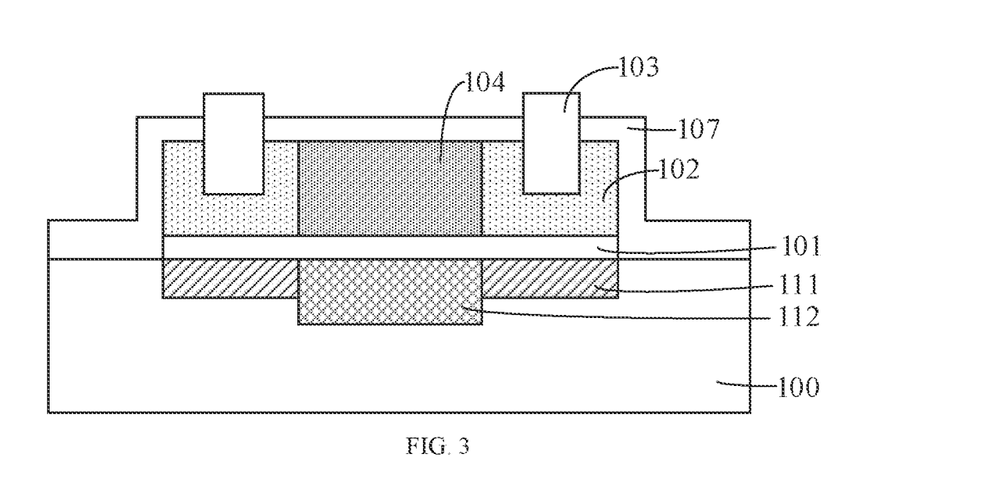
FIG. 3 is a partial and cross-sectional schematic structural diagram of a photovoltaic cell according to an embodiment of the present disclosure.
Figure 4:
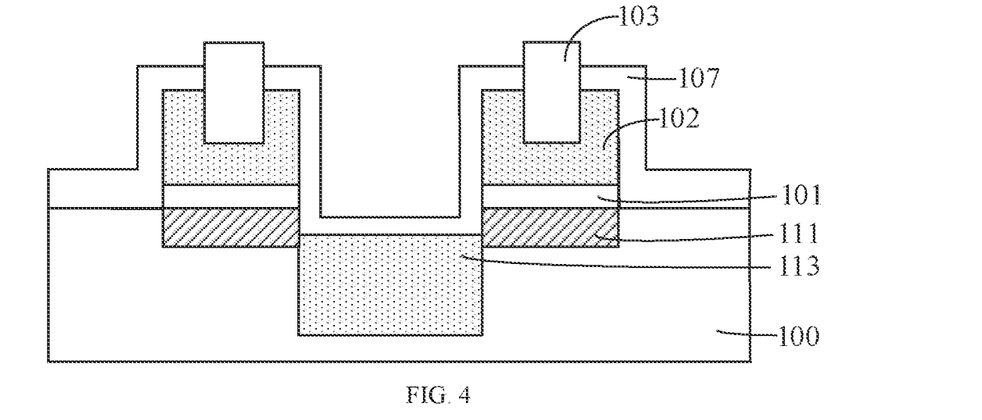
FIG. 4 is another partial and cross-sectional schematic structural diagram of a photovoltaic cell according to an embodiment of the present disclosure.
Figure 5:
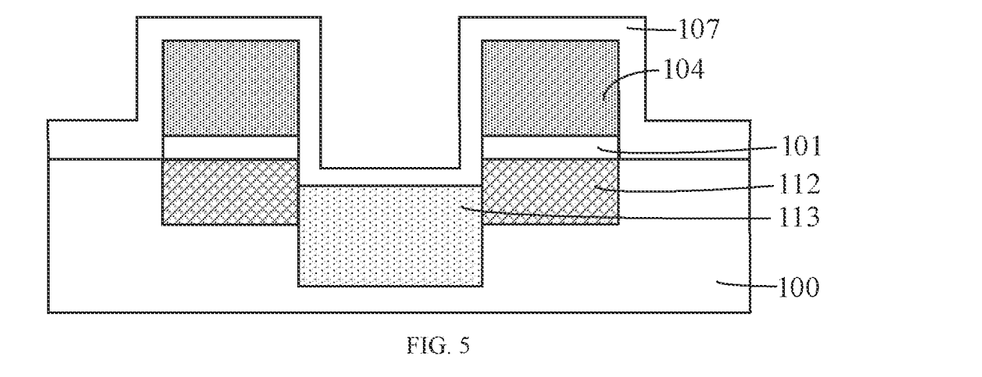
FIG. 5 is yet another partial and cross-sectional schematic structural diagram of a photovoltaic cell according to an embodiment of the present disclosure.
Figure 6:
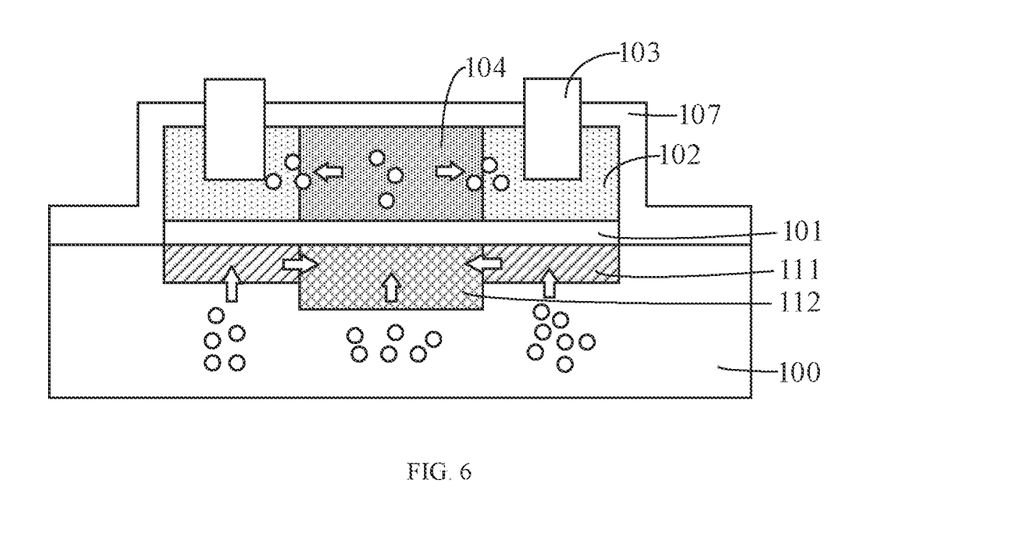
FIG. 6 is a schematic diagram of carrier transporting in a photovoltaic cell according to an embodiment of the present disclosure.
Figure 7:
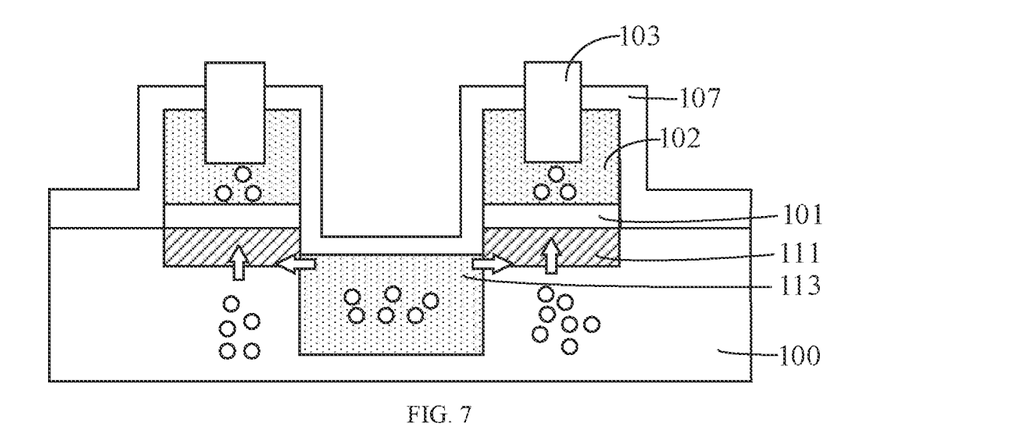
FIG. 7 is another schematic diagram of carrier transporting in a photovoltaic cell according to an embodiment of the present disclosure.
Figure 8:
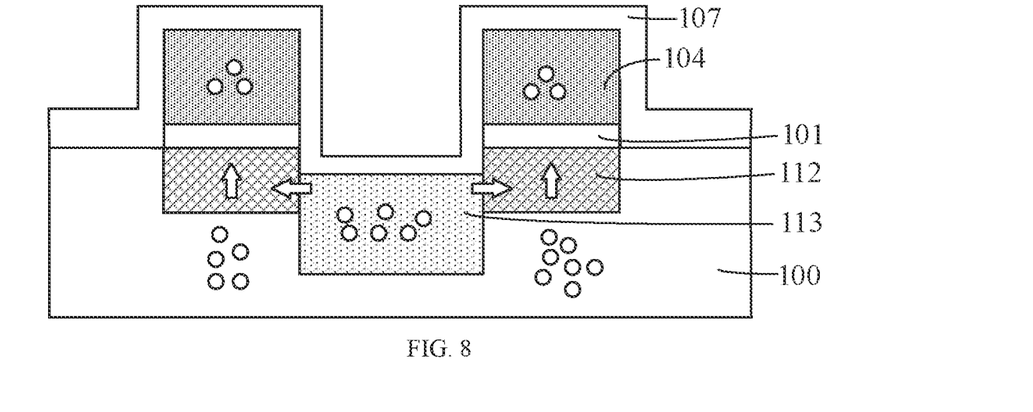
FIG. 8 is yet another schematic diagram of carrier transporting in a photovoltaic cell according to an embodiment of the present disclosure.
Figure 9:
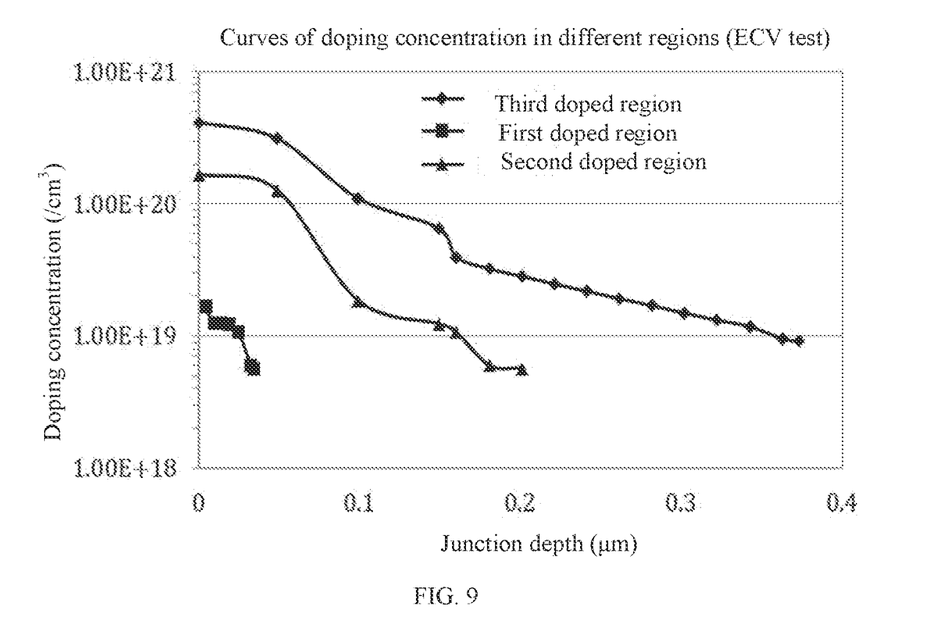
FIG. 9 is an Electrochemical Capacitance Voltage (ECV) doping concentration graph of a doped layer in a photovoltaic cell according to an embodiment of the present disclosure.

FIG. 1 is a schematic structural diagram of a photovoltaic cell according to an embodiment of the present disclosure. FIG. 2 is a schematic structural diagram of a doped layer in a photovoltaic cell according to an embodiment of the present disclosure. FIG. 3 is a partial and cross-sectional schematic structural diagram of a photovoltaic cell according to an embodiment of the present disclosure. FIG. 4 is another partial and cross-sectional schematic structural diagram of a photovoltaic cell according to an embodiment of the present disclosure. FIG. 5 is yet another partial and cross-sectional schematic structural diagram of a photovoltaic cell according to an embodiment of the present disclosure. FIG. 6 is a schematic diagram of carrier transporting in a photovoltaic cell according to an embodiment of the present disclosure. FIG. 7 is another schematic diagram of carrier transporting in a photovoltaic cell according to an embodiment of the present disclosure. FIG. 8 is yet another schematic diagram of carrier transporting in a photovoltaic cell according to an embodiment of the present disclosure. FIG. 9 is an Electrochemical Capacitance Voltage (ECV) doping concentration graph of a doped layer in a photovoltaic cell according to an embodiment of the present disclosure. FIGS. 3 and 6 show cross-sectional views along an $A_1$-$A_2$ direction of a structure in FIG. 1, FIGS. 4 and 7 show cross-sectional views along an $B_1$-$B_2$ direction of the structure in FIG. 1, and FIGS. 5 and 8 show cross-sectional views along an $C_1$-$C_2$ direction of the structure in FIG. 1.

Referring to FIGS. 1 to 8, a photovoltaic cell includes a substrate 100, a doped layer 110, at least one tunneling dielectric layer 101, a plurality of doped conductive layers 102, a plurality of first electrodes 103, and a plurality of conductive transport layers 104. The doped layer 110 is disposed in a portion of the substrate 100 adjacent to a first surface of the substrate 100, a doping element type of the doped layer 110 is the same as a doping element type of the substrate 100, and a doping concentration of the doped layer 110 is greater than a doping concentration of the substrate 100. The doped layer 110 includes a plurality of first doping regions 111 arranged at intervals along a first direction Y, a plurality of second doping regions 112 between respective two adjacent first doping regions 111, and a plurality of third doping regions 113 between the respective two adjacent first doping regions 111. A doping concentration of each of the plurality of first doping regions 111 is less than a doping concentration of each of the plurality of second doping regions 112 and less than a doping concentration of each of the plurality of third doping regions 113. The at least one tunneling dielectric layer 101 is disposed on the plurality of first doped regions 111 and the plurality of second doped regions 112. The plurality of doped conductive layers 102 are arranged at intervals along the first direction Y, and each of the plurality of doped conductive layers 102 is aligned with a respective first doped region 111 and disposed on a respective tunneling dielectric layer 101. The plurality of first electrodes 103 are arranged at intervals along the first direction Y, the plurality of first electrodes 103 extend along a second direction X, and each of the plurality of first electrodes 103 is disposed on a side of a respective doped conductive layer 102 away from the substrate 100 and electrically connected to the respective doped conductive layer 102. Each of the plurality of conductive transport layers 104 is aligned with a respective second doped region 112 and disposed on a respective tunneling dielectric layer 101, and each of the plurality of conductive transport layers 104 is disposed between respective two adjacent doped conductive layers 102 and in contact with side walls of the respective two adjacent doped conductive layers 102.

The substrate 100 is configured to receive incident light and generate photogenerated carriers. In some embodiments, a material of the substrate 100 may include at least one of monocrystalline silicon, polysilicon, amorphous silicon, or microcrystalline silicon. In some embodiments, a material of the substrate 100 may also include silicon carbide, an organic material, or multicomponent compounds. The multicomponent compounds may include, but are not limited to, materials such as perovskite, gallium arsenide, cadmium telluride, copper indium selenium, and the like.

In some embodiments, the substrate 100 has doping elements, and a type of the doping elements includes N-type or P-type. The N-type elements may be group V elements such as phosphorus (P), bismuth (Bi), antimony (Sb), arsenic (As), or the like. The P-type elements may be group III elements such as boron (B), aluminum (Al), gallium (Ga), indium (In), or the like. For example, when the substrate 100 is a P-type substrate, the type of the doping elements in the substrate 100 is P-type. Alternatively, when the substrate 100 is an N-type substrate, the type of the doping elements in the substrate 100 is N-type. Specifically, in some embodiments, the substrate 100 may be the N-type substrate, and the substrate 100 may be doped with N-type doping ions, e.g., any of phosphorus ions, bismuth ions, antimony ions, or arsenic ions.

In some embodiments, the photovoltaic cell is a tunnel oxide passivated contact (TOPCON) cell, the substrate 100 further includes a second surface disposed opposite the first surface, and both the first surface and the second surface of the substrate 100 may be configured to receive incident or reflected light. In some embodiments, the first surface may be a rear surface of the substrate 100, and the second surface may be a front surface of the substrate 100. In some embodiments, the first surface may be the front surface of the substrate 100, and the second surface may be the rear surface of the substrate 100.

In some embodiments, the first surface of the substrate 100 may be provided as a non-pyramidal texture surface, such as a laminated step morphology, such that the tunneling dielectric layers 101 disposed on the first surface of the substrate 100 have a high degree of density and uniformity and thus having a good passivation effect on the first surface of the substrate 100. The second surface of the substrate 100 may be provided as a pyramid texture surface such that the second surface of the substrate 100 has a lower reflectivity to the incident light and thus having a large absorption and utilization rate of the light.

In some embodiments, the material of the doped layer 110 includes at least one of monocrystalline silicon, microcrystalline silicon, amorphous silicon, or polysilicon.

The material of the doped layer 110 is the same as at least one of the material of the substrate 100, the material of the doped conductive layers 102, or the material of the conductive transport layers 104. In some embodiments, when the material of the doped layer 110 is the same as the material of the substrate 100, the doped layer 110 and the substrate 100 may be considered the same original substrate, the doped layer 110 is disposed in a portion of the original substrate adjacent to the first surface of the original substrate, and upper surfaces of the first doped regions 111, the second doped regions 112, and the third doped regions 113 in the doped layer 110 are flush with each other. The material of the doped layer 110 is the same as that of the substrate 100, thereby avoiding recombination of partial carriers and reduced efficiency of the cell, which are caused by no interface state defect between the doped layer 110 and the substrate 100 due to the consumption of photogenerated carriers due to the electrical conductivity of different materials. In some embodiments, lower surfaces of the first doped regions 111, the second doped regions 112, and the third doped regions 113 are flush with each other.

In some embodiments, the doped layer is also a diffusion layer, which may be formed by a separate diffusion process (i.e., direct doping on the surface of the doped layer), or may be a portion of the substrate having a greater doping concentration than the substrate, which is formed by doping elements of diffusion processes in which the doped conductive layers and the conductive transport layers are formed penetrating into the substrate (such that this portion of the substrate (i.e., the doped layer) having the greater doping concentration than the substrate), or may be formed by a combination of the above two manners.

In addition, the open-circuit voltage is related to a band gap Eg of the material. The closer a Fermi level of the material to the top of a conduction band and the top of a full band, the higher a built-in barrier voltage of a PN junction, the larger the open-circuit voltage, and the easier the carriers to transition. When the material of the doped layer 110 is different from the material of the substrate 100, the carriers need to transition an interface barrier region between the substrate 100 and the doped layer 110 and interface barrier regions between the doped layer 110 and the tunneling dielectric layers 101, so that the consumption of the carriers is large. Moreover, band gaps of various materials are different, i.e., the open-circuit voltages thereof are also different, and the mobility of carriers in different materials is also different, thereby affecting the efficiency of the cell.

It should be understood that since the doping concentration of each third doped region 113 is greater than that of each first doped region 111 and that of each second doped region 112, the time for laser processing in each third doped region 113 is larger than the time for laser processing in each second doped region 112 and in each first doped region 111 when laser doping is used, so that the upper surface of the third doped region 113 away from the substrate 100 is lower than that of the second doped region 112 and that of the first doped region 111.

In some embodiments, referring to FIGS. 6-8, the doping concentration of the doped layer 110 is greater than the doping concentration of the substrate 100, and a high-low junction is formed between the doped layer 110 and the substrate 100, so that a built-in electric field is formed between the doped layer 110 and the substrate 100, positive space charges are formed on the surface of the doped layer 110 with the greater doping concentration, and negative space charges are formed on the surface of the substrate 100 with the less doping concentration, thereby most carriers in the substrate 100 are easily drift to the doped layer 110 with the greater doping concentration, which is conducive to increasing an output current of the photovoltaic cell. Meanwhile, due to the existence of the built-in electric field, there is a potential barrier between the substrate 100 and the doped layer 110, thus blocking the drift of majority carriers in the doped layer 110 with the greater doping concentration to the substrate 100 with the less doping concentration.

In some embodiments, in the first direction Y, the second doping regions 112 are located between adjacent two first doping regions 111 and the third doping regions 113 are located between adjacent two first doping regions 111; in the second direction X, the second doped regions 112 are interleaved with the third doped regions 113.

A total doping amount of the first doped regions is less than a total doping amount of the second doped regions and less than a total doping amount of the third doped regions. The total doping amount of the first doped regions 111 may be understood as a total amount of doping elements in the first doped regions 111, and the total doping amount is related to the doping concentration and the doping depth. The total doping amount of the second doped regions 112 may be understood as a total amount of doping elements in the second doped regions 112, and the total doping amount of the third doped regions 113 may be understood as a total amount of doping elements in the third doped regions 113. The total doping amount of the first doped regions 111 being less than the total doping amount of the second doped regions 112 and less than the total doping amount of the third doped regions 113 means that the doping concentration of each first doped region 111 is less than the doping concentration of each second doped region 112 and less than the doping concentration of each third doped region 113, or a doping depth of each first doped region 111 is less than a doping depth of each second doped region 112 and less than a doping depth of each third doped region 113, alternatively, means that the doping concentration of each first doped region 111 is less than the doping concentration of each second doped region 112 and less than the doping concentration of each third doped region 113, and the doping depth of each first doped region 111 is less than the doping depth of each second doped region 112 and less than the doping depth of each third doped region 113. In conventional technologies, in order to improve the contact between the doped conductive layers 102 and the first electrodes 103, the doped conductive layers are usually configured to be highly doped. In the embodiments of the present disclosure, the total doping amount of the first doped regions 111 is less than the total doping amount of the second doped regions 112 and less than the total doping amount of each third doped regions 113. On the one hand, the decrease of the band gap of the substrate 100 due to the excessive concentration of the doping elements below the first electrodes 103 is avoided, so that the reduction of the open-circuit voltage of the photovoltaic cell and the decay of the electric field are avoided. On the other hand, a high doping effect (e.g., a tunneling effect produces a composite current) caused by an excessive doping concentration of the doped conductive layers 102 and the excessive doping concentration of the doped layer 110 is avoided. However, by providing the plurality of second doping regions 112 with the large doping concentration and the plurality of third doping regions 113 with the large doping concentration, the carrier transporting efficiency in the region unaligned with the first electrodes is improved, so that the open-circuit voltage of the photovoltaic cell is increased, which is conducive to improving the photoelectric conversion efficiency of the photovoltaic cell.

In some embodiments, referring to FIG. 9, the doping depth of each first doped region 111 is a range of 30 nm to 300 nm, preferably, the doping depth of the first doped region 111 is in a range of 50 nm to 280 nm, in particular 59 nm, 103 nm, 159 nm, 213 nm, 280 nm, etc. The doping concentration of each first doped region 111 is in a range of 5E19 cm$^{-3}$ to 1E21 cm$^{-3}$, and optionally, the doping concentration of the first doped region 111 is in a range of 8E19 cm$^{-3}$ to 9E20 cm$^{-3}$, in particular 9E19 cm$^{-3}$, 1.2E20 cm$^{-3}$, 4.5E20 cm$^{-3}$, 7.8E20 cm$^{-3}$, 9E20 cm$^{-3}$, etc.

In some embodiments, the doping depth of each second doped region 112 is in a range of 50 nm to 500 nm, preferably, the doping depth of the second doped region 112 is in a range of 70 nm to 450 nm, in particular 73 nm, 180 nm, 261 nm, 379 nm, 450 nm, etc. The doping concentration of each second doped region 112 is in a range of 1E20 cm$^{-3}$ to 3E21 cm$^{-3}$, and optionally, the doping concentration of the second doped region 112 is in a range of 2E20 cm$^{-3}$ to 2.5E21 cm$^{-3}$, in particular 2E20 cm$^{-3}$, 5E20 cm$^{-3}$, 8E20 cm$^{-3}$, 1.6E21 cm$^{-3}$, 2.5E21 cm$^{-3}$, etc.

In some embodiments, the doping depth of each third doped region 113 is in a range of 200 nm to 1500 nm, preferably, the doping depth of the third doped region 113 is in a range of 250 nm to 1300 nm, in particular 260 nm, 580 nm, 931 nm, 1060 nm, 1290 nm, etc. The doping concentration of each third doped region 113 is in a range of 5E17 cm$^{-3}$ to 1E20 cm$^{-3}$, and optionally, the doping concentration of the third doped region 113 is in a range of 6E17 cm$^{-3}$ to 1E20 cm$^{-3}$, in particular 6E17 cm$^{-3}$, 4E18 cm$^{-3}$, 1E19 cm$^{-3}$, 8.3E19 cm$^{-3}$, 1E20 cm$^{-3}$, etc.

In some embodiments, the total doping amount of the second doped regions 112 is less than or equal to the total doping amount of the third doped regions 113, including the doping concentration of each second doped region 112 is less than or equal to the doping concentration of each third doped region 113 or the doping depth of each second doped region 112 is less than or equal to the doping depth of each third doped region 113, alternatively, including the doping concentration of each second doped region 112 is less than or equal to the doping concentration of each third doped region 113 and the doping depth of each second doped region 112 is less than or equal to the doping depth of each third doped region 113. The conductive transport layers 104 are disposed between adjacent two doped conductive layers 102. The conductive transport layers 104 are configured to enhance the transport capability of the cell and is in direct contact with the side walls of the doped conductive layers 102. The low doping of the second doped regions 112 that are aligned with the doped conductive layers 102 is able to avoid the high doping effect (e.g., the tunneling effect produces the composite current).

In some embodiments, the tunneling dielectric layers 101 and the doped conductive layers 102 may be configured to constitute a passivation contact structure on the surface of the substrate 100. By forming the tunneling dielectric layers 101 and the doped conductive layers 102, the recombination of carriers on the surface of the substrate 100 may be reduced, thereby increasing the open-circuit voltage of the photovoltaic cell and improving the photoelectric conversion efficiency of the photovoltaic cell. Specifically, the tunneling dielectric layers 101 may reduce the defect state concentration of the first surface of the substrate 100 so as to reduce the recombination center of the first surface of the substrate 100, thereby reducing the recombination rate of carriers.

The doped conductive layers 102 are configured to form a field passivation layer to make the minority carriers escape from the interface, so as to reduce the concentration of the minority carriers, so that the recombination rate of carriers at the interface of the substrate 100 is low, and the open-circuit voltage, the short-circuit current and the filling factor of the photovoltaic cell are large, thereby improving the photoelectric conversion performance of the photovoltaic cell. In some embodiments, the doped conductive layers 102 have doping elements of the same conductivity type as the substrate 100.

The plurality of doped conductive layers 102 extend along the second direction X, and the plurality of doped conductive layers 102 are arranged at intervals in the first direction Y perpendicular to the second direction X. In some embodiments, the plurality of first electrodes 103 are in one-to-one correspondence with the plurality of doped conductive layers 102, i.e., each of the plurality of first electrodes 103 is electrically connected to a respective one of the plurality of doped conductive layers 102. That is, the doped conductive layers 102 are provided only in the region corresponding to the first electrodes 103, so that the parasitic absorption effect of the region in which the first electrode 103 is not provided is reduced, and the utilization of the substrate 100 to light is improved. In some embodiments, the material of the first electrodes 103 may include at least one of silver, aluminum, copper, tin, gold, lead, or nickel.

The tunneling dielectric layers 101 and the doped conductive layers 102 are stacked. Specifically, in some embodiments, the tunneling dielectric layers 101 may cover the entire first surface of the substrate 100, and a plurality of doped conductive layers 102 are disposed at intervals on a top surface of the whole tunneling dielectric layer 101. In some embodiments, the tunneling dielectric layers 101 are disposed with respect to the doped conductive layers 102, i.e., a respective tunneling dielectric layers 101 is disposed between a corresponding doped conductive layer 102 and the substrate 100. Moreover, a respective tunneling dielectric layer 101 is also disposed between a corresponding conductive transport layer 104 and the substrate 100, so that this portion of the tunneling dielectric layer 101 is capable of reducing the carrier recombination of the first surface of the substrate 100, thereby increasing the concentration of carriers transported into the conductive transport layer 104.

In some embodiments, the material of the tunneling dielectric layer 101 may include, but is not limited to, a dielectric material having the tunneling effect, such as aluminum oxide, silicon oxide, silicon nitride, silicon oxynitride, intrinsic amorphous silicon, intrinsic polysilicon, and the like. Specifically, the tunneling dielectric layer 101 may be formed of a silicon oxide layer including silicon oxide (SiOx), because the silicon oxide has good passivation characteristics and carriers are able to easily tunnel the silicon oxide layer.

In some embodiments, the material of the conductive transport layer 104 is the same as that of the doped conductive layer 102. By providing the conductive transport layer 104 with the same material as the doped conductive layer 102, on the one hand, types of the materials throughout the production process are reduced for ease of management; on the other hand, the contact between the conductive transport layer 104 and the doped conductive layer 102 is good, so that the carriers have a good transport effect at the contact interfaces between the doped conductive layer 102 and the conductive transport layer 104, thereby reducing the transport loss. In addition, the transport rate of carriers in the conductive transport layer 104 may be similar to or the same as the transport rate of carriers in the doped conductive layer 102, thereby improving the transport efficiency of carriers from the conductive transport layer 104 to the doped conductive layer 102. It should be noted that the conductive transport layer 104 have the same material as the doped conductive layers herein means that the type of doping ions in the conductive transport layer 104 are the same as those in the doped conductive layer 102.

In some embodiments, the material of the doped conductive layer 102 includes at least one of doped amorphous silicon, doped polysilicon, or doped microcrystalline silicon. Accordingly, the material of the conductive transport layer 104 may also include at least one of doped amorphous silicon, doped polysilicon, or doped microcrystalline silicon.

It should be appreciated that in some embodiments, the material of the conductive transport layer 104 may also be different from the material of the doped conductive layer 102. For example, the material of the conductive transport layer 104 may include one of doped amorphous silicon, doped polysilicon, or doped microcrystalline silicon, and the material of the doped conductive layer 102 may include the other of doped amorphous silicon, doped polysilicon, or doped microcrystalline silicon.

In some embodiments, when the material of the conductive transport layer 104 is different from the material of the doped conductive layer 102, the material of the conductive transport layer 104 may be provided as having an absorption coefficient to the incident light less than the absorption coefficient of the conductive transport layer 104 to the incident light, so that the absorption capability of the conductive transport layer 104 to the incident light is reduced while the lateral transport capability of carriers is improved, thereby improving the utilization of the photovoltaic cell to the incident light.

In some embodiments, a plurality of conductive transport layers 104 are provided, and the plurality of conductive transport layers 104 are arranged at intervals along the second direction X. A plurality of conductive transport layers 104 are disposed between two adjacent doped conductive layers 102 so that the majority carriers in the substrate 100 are able to be transported into the doped conductive layers 102 through the plurality of conductive transport layers 104, thereby enhancing the lateral transport capability of the majority carriers in the substrate 100. In addition, the plurality of conductive transport layers 104 are arranged at intervals, i.e., the conductive transport layers 104 are disposed not in the entire region between the two adjacent doped conductive layers 102, but in partial regions between the two adjacent doped conductive layers 102. In this way, when the material of the conductive transport layer 104 is the same as the material of the doped conductive layer 102, an overall area of the conductive transport layers 104 is not excessively large, so that low utilization of the substrate 100 to the incident light due to the excessively strong absorption capability of the conductive transport layers 104 to the incident light is avoided.

In some embodiments, the plurality of conductive transport layers 104 are arranged in an array, which include a plurality of rows of conductive transport layers 104 arranged at intervals along a first direction Y. Each row of conductive transport layers 104 include a plurality of conductive transport layers 104 arranged at intervals along a second direction X, and at least one first electrode 103 is disposed between two adjacent rows of conductive transport layers 104 along the first direction Y. That is, in some embodiments, when only one first electrode 103 is disposed between two adjacent conductive transport layers 104, there is a conductive transport layer 104 between every two adjacent first electrodes 103. In some embodiments, a plurality of first electrodes 103 may be provided between two adjacent rows of conductive transport layers 104, such that a part of two adjacent first electrodes 103 have a conductive transport layer 104 therebetween and a part of two adjacent first electrodes 103 do not have a conductive transport layer 104 therebetween. For example, in the second direction X, there is a conductive transport layer 104 between a $1^{st}$ first electrode 103 and a $2^{nd}$ first electrode 103, and there is no conductive transport layer 104 between the $2^{nd}$ first electrode 103 and a $3^{rd}$ first electrode 103. It should be understood that when the material of the conductive transport layer 104 is the same as the material of the doped conductive layer 102, the more the number of the conductive transport layers 104, the stronger the absorption capability of the incident light while enhancing the lateral transport capability of the carriers. Therefore, the connection relationship between the conductive transport layers 104 and the doped conductive layers 102 is flexibly set based on a total number of the first electrodes 103 and the demand for the current collection capability of the first electrodes 103, so that the conductive transport layers 104 do not have strong absorption of the incident light while improving the carrier transport capability.

Referring to FIG. 1, in some embodiments, there is a conductive transport layer 104 between every two adjacent first electrodes 103. By providing the conductive transport layer 104 between each two adjacent first electrodes 103, the lateral transport capability between adjacent first electrodes 103 is improved, thereby improving the current collecting capability of each first electrode 103.

In some embodiments, each conductive transport layer 104 in a row corresponds to a respective conductive transport layer 104 in an adjacent row, and the two conductive transport layers 104 corresponding to each other are arranged at intervals along the first direction Y. For example, each conductive transport layer 104 in a first row is aligned with a corresponding conductive transport layer 104 in a second row in the first direction Y, and each row of conductive transport layers 104 are arranged regularly. In this way, the number of conductive transport layers 104 is large, thereby forming a large number of lateral transport channels for lateral transport of carriers in the substrate 100. Moreover, since each row of conductive transport layers 104 are arranged regularly, the process of forming the conductive transport layers 104 is simplified in actual preparation process.

In some embodiments, a plurality of conductive transport layers 104 in a row are misaligned with a plurality of conductive transport layers 104 in an adjacent row in the second direction X. For example, each of a first row of conductive transport layers 104 is misaligned with each of a second row of conductive transport layers 104 in the first direction Y, i.e., each of the first row of conductive transport layers 104 is staggered with each of the second row of conductive transport layers 104 in the second direction X. The plurality of conductive transport layers 104 are arranged to be staggered so that, on the one hand, the number of the conductive transport layers 104 is not excessive, thereby avoiding the conductive transport layers 104 from absorbing too much incident light; on the other hand, the conductive transport layers 104 are able to be uniformly disposed on the first surface of the substrate 100 while the number of the conductive transport layers 104 is set to be small, so that the lateral transport capability of carriers at different positions in the substrate 100 is enhanced.

In some embodiments, in the second direction X, the density of the conductive transport layers 104 near the edge of the substrate 100 is greater than the density of the conductive transport layers 104 away from the edge of the substrate 100, e.g., the space in the second direction X between two adjacent conductive transport layers 104 near the edge of the substrate 100 is smaller than the space in the second direction X between two adjacent conductive transport layers 104 away from the edge of the substrate 100. In this way, the density of the conductive transport layers 104 near the edge of the substrate 100 is greater than the density of the conductive transport layers 104 away from the edge of the substrate 100, that is, the lateral transport capability of the carriers near the edge of the substrate 100 is stronger, so that the concentration of carriers in the first electrodes 103 near the edge of the substrate 100 is larger, thereby compensating for the number of carriers collected by outermost second electrodes 106, and improving the capability of the outermost second electrodes 106 to collect current.

In some embodiments, a top surface of a respective conductive transport layer 104 is lower than or flush with a top surface of a respective doped conductive layer 102. By providing the top surface of the conductive transport layer 104 to be not higher than the top surface of the doped conductive layer 102, the problem of the incident light on side walls of the conductive transport layer 104 due to the top surface of the conductive transport layer 104 protruding from the top surface of the doped conductive layer 102 is prevented, thereby reducing the parasitic absorption capability of the conductive transport layer 104 to the incident light. A height of the conductive transport layer 104 may be 0.5 to 1.2 times a height of the doped conductive layer 102 in a direction perpendicular to the surface of the substrate 100.

In some embodiments, referring to FIG. 6 and FIG. 7, a doping element type of the doped conductive layer 102 is the same as a doping element type of the doped layer 110. A doping concentration of the doped layer 110 is less than that of the doped conductive layer 102. A high-low junction is formed between the doped layer 110 and the substrate 100, and a first built-in electric field is formed between the doped layer 110 and the substrate 100. A high-low junction is formed between the doped layer 110 and the doped conductive layer 102, a second built-in electric field is formed between the doped layer 110 and the doped conductive layer 102, and directions of voltages of the first built-in electric field and the second built-in electric field are the same, so that a double voltage difference is formed. Majority carriers tending to the internal of the substrate 100 are easily drift to the doped layer 110 that is highly doped, and then drift to the doped conductive layer 102, and finally collected by the first electrode 103, which is conducive to increasing an output current of the cell. Meanwhile, due to the presence of the built-in electric fields, a barrier exists between the substrate 100 and the doped layer 110, and a barrier exists between the doped layer 110 and the doped conductive layer 102, thereby blocking the drift of the majority carriers in the highly-doped layers to the low-doped substrate 100.

Similarly, referring to FIG. 8, a doping element type of the conductive transport layer 104 is the same as the doping element type of the doped layer 110. A doping concentration of the conductive transport layer 104 is greater than the doping concentration of the doping layer 110. A high-low junction is formed between the doped layer 110 and the conductive transport layer 104, a third built-in electric field is formed between the doped layer 110 and the conductive transport layer 104, and directions of voltages of the first built-in electric field and the third built-in electric field are the same, so that a double voltage difference is formed. Majority carriers tending to the internal of the substrate 100 are easily drift to the doped layer 110 that is highly doped, and then drift to the conductive transport layer 104, and further drift to the doped conductive layer 102, and finally collected by the first electrode 103, which is conducive to increasing the output current of the cell. Meanwhile, the presence of the built-in electric fields prevents the majority carriers in the highly-doped layers from drifting to the low-doped substrate 100.

Figure 10:
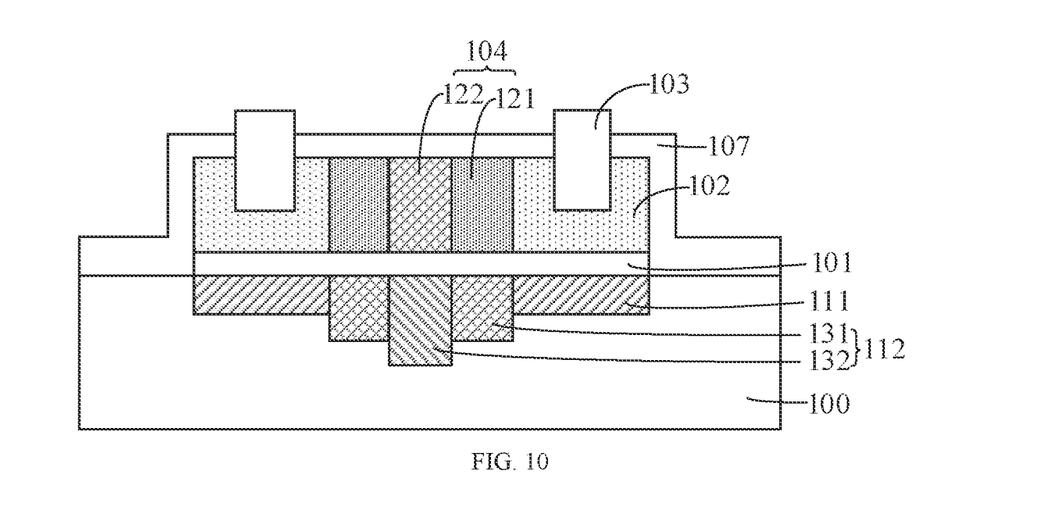
FIG. 10 is still another partial and cross-sectional schematic structural diagram of a photovoltaic cell according to an embodiment of the present disclosure.

FIG. 10 is still another partial and cross-sectional schematic structural diagram of a photovoltaic cell according to an embodiment of the present disclosure.

In some embodiments, referring to FIG. 10, a conductive transport layer 104 includes body portions 121 arranged at intervals and a connection portion 122 between the adjacent body portions 121 in the first direction Y, the body portions 121 are in contact with side walls of the respective two adjacent doped conductive layers 102, and a doping concentration of the body portion 121 is less than or equal to a doping concentration of the connection portion 122. Since the conductive transport layer 104 serves as a lateral transport channel for carriers, a concentration of carriers in portions (i.e., the body portions 121) of a conductive transport layer 104 adjacent to the doped conductive layers 102 is relatively high, so that portions of the doped conductive layers 102 adjacent to the body portions 121 also have a relatively high carrier concentration, and therefore the current collecting capability of the first electrode 103 is improved. Meanwhile, the doping concentration at the connection portion 122 is relatively small, and the light absorption is relatively weak, so that the conductive transport layer 104 is avoided from absorbing too much incident light, thereby improving the photoelectric conversion performance of the photovoltaic cell as a whole.

In some embodiments, a ratio of a total area of connection portions 122 in the plurality of conductive transport layers 104 to an area of a conductive transport layer 104 is in a range of 1:11 to 2:3, and optionally, the ratio of the total area of the connection portion 122 to the area of the conductive transport layer 104 is in range of ⅓ to ⅔, in particular 0.4, 0.48, 0.56, 0.62, etc. The larger area proportion of the body portions 121 enhances the current collecting ability of the first electrode 103, reduces the absorption of light, and improves the cell efficiency. When the area proportion of the connection portion 122 is larger, the lateral transmission capability of the carriers is improved.

In some embodiments, a top surface of a connection portion 122 has a light trapping structure. The light trapping structure may enhance the reflectivity of the top surface of the conductive transport layer 104 to the incident light, so that the incident light irradiated to the top surface of the conductive transport layer 104 may be reflected away, preventing absorption by the conductive transport layer 104. This portion of the reflected incident light may also be reflected back, for example, to regions that are not covered by the doped conductive layer 102 and the conductive transport layer 104, thereby being absorbed and utilized by the substrate 100, so that the absorption and utilization of the incident light by the substrate 100 are enhanced.

In some embodiments, a cross-sectional shape of the connection portion 122 in a direction perpendicular to the first surface includes a triangular shape, a rectangular shape, a trapezoidal shape, or an elliptical shape, and the top surface of the connection portion 122 is lower than the top surface of the body portion 121, so that the doped conductive layer 102 has a certain shielding effect on the incident light irradiated to the top surface of the conductive transport layer 104. In addition, the incident light is also reflected for multiple times on side walls of the connection portion 122, thereby reducing parasitic absorption of the top surface of the conductive doped layer 110 to the incident light. It should be appreciated that, in some embodiments, the cross-sectional shape of the connecting portion 122 may include other shapes, as long as the top surface of the connecting portion is recessed toward the substrate 100.

In some embodiments, a second doping region 112 includes first sub-doping portions 131 arranged at intervals and a second sub-doping portion 132 between the adjacent first sub-doping portions 131, each first sub-doping portion 131 is aligned with a respective body portion 121, and the second sub-doping portion 132 is aligned with the connection portion 122. A doping concentration of the first sub-doping portion 131 is less than or equal to the doping concentration of the second sub-doping portion 132. A total doping amount of the first sub-doping portions 131 is less than or equal to a total doping amount of the second sub-doping portion 132. The total doping amount of the first sub-doped portion 131 being less than or equal to the total doping amount of the second sub-doped portion 132 includes that the doping concentration of the first sub-doped portion 131 is less than or equal to the doping concentration of the second sub-doped portion 132 or a doping depth of the first sub-doped portion 131 is less than or equal to a doping depth of the second sub-doped portion 132 in a direction perpendicular to the first surface, alternatively, includes that the doping concentration of the first sub-doping portion 131 is less than or equal to the doping concentration of the second sub-doping portion 132 and the doping depth of the first sub-doping portion 131 is less than or equal to the doping depth of the second sub-doping portion 132. The connection portion 122 is located between adjacent body portions 121, the body portions 121 are directly in contact with the side walls of the doped conductive layers 102, the conductive transport layer 104 is configured to enhance the transport capability of the cell, and the low doping of the first sub-doping portion 131 aligned with the body portion 121 is able to avoid the high doping effect (e.g., the tunneling effect generates the composite current). The high doping of the second sub-doping portion 132 aligned with the connection portion 122 is able to increase the transmission rate of carriers.

In some embodiments, the photovoltaic cell further includes a passivation layer 107 disposed on the doped conductive layers 102, the conductive transport layers 104 and the third doped regions 113. The passivation layer 107 may be considered a rear passivation layer. The passivation layer 107 may include a single layer structure or a stacked layer structure, and the material of the passivation layer 107 may include one or more of silicon oxide, silicon nitride, silicon oxynitride, silicon oxycarbonitride, titanium oxide, hafnium oxide, aluminum oxide, etc.

The first electrode 103 includes a grid line of the photovoltaic cell for collecting and aggregating current of the photovoltaic cell. The first electrode 103 may be sintered from a burnthrough-type slurry. The material of the first electrode 103 may include one or more of aluminum, silver, gold, nickel, molybdenum, copper, etc. In some embodiments, the first electrode 103 refers to a fine grid line or finger grid line to distinguish from a main grid line or bus bar.

In some embodiments, the photovoltaic cell further includes an emitter disposed on a second surface of the substrate 100 away from the doped layer 110, a first passivation layer disposed on a surface of the emitter away from the substrate 100, and a plurality of electrodes spaced apart. A doping element type of the emitter is different from the doping element type of the substrate 100, the first passivation layer is regarded as a front passivation layer, and the plurality of electrodes penetrate through the first passivation layer and are in contact with the emitter.

In some embodiments, the first passivation layer may include a single layer structure or a stacked layer structure, and the material of the first passivation layer may include one or more of silicon oxide, silicon nitride, silicon oxynitride, silicon oxycarbonitride, titanium oxide, hafnium oxide, aluminum oxide, etc.

The plurality of electrodes are sintered from a burn-through-type slurry. The contact between the electrodes and the emitter may be local or full contact. The material of the electrodes may be one or more of aluminum, silver, nickel, gold, molybdenum, copper, etc. In some embodiments, the electrodes are upper electrodes or front electrodes. In some embodiments, the electrodes refer to fine grid lines or finger grid lines to distinguish from the main grid line or bus bar.

In some embodiments, an antireflection layer for antireflection of the incident light may be provided on the surface of the emitter away from the substrate 100. In some embodiments, the antireflection layer may be a silicon nitride layer, and the silicon nitride layer may include a silicon nitride material. In some embodiments, the antireflection layer may also be provided as a multilayer structure, for example, a stacked structure which may be composed of one or more of silicon nitride, silicon oxide, or silicon oxynitride.

In some embodiments, the second surface of the substrate 100 may also have a structure similar to the first surface of the substrate 100, for example, a second tunneling dielectric layer and a second doped conductive layer may be sequentially stacked on the second surface of the substrate 100 in a direction away from the second surface of the substrate 100. A type of doping ions in the second doped conductive layer is different from the type of doping ions in the doped conductive layer 102.

Figure 11:
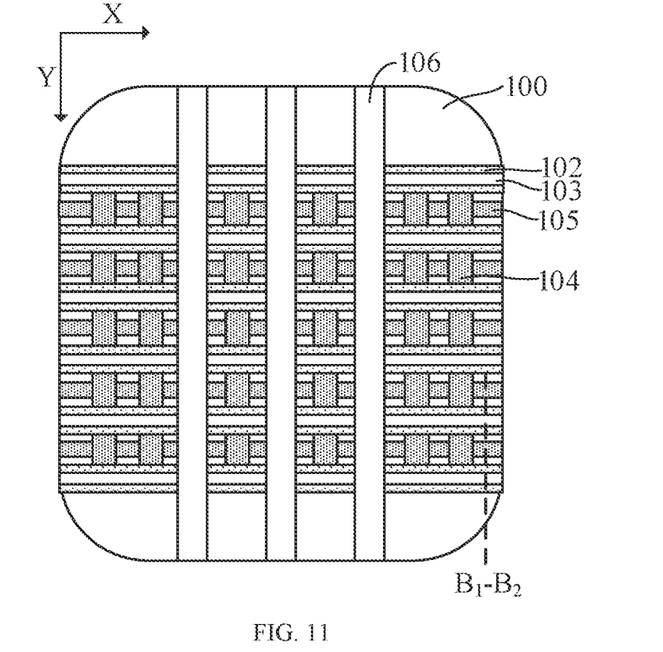
FIG. 11 is another schematic structural diagram of a photovoltaic cell according to an embodiment of the present disclosure.
Figure 12:
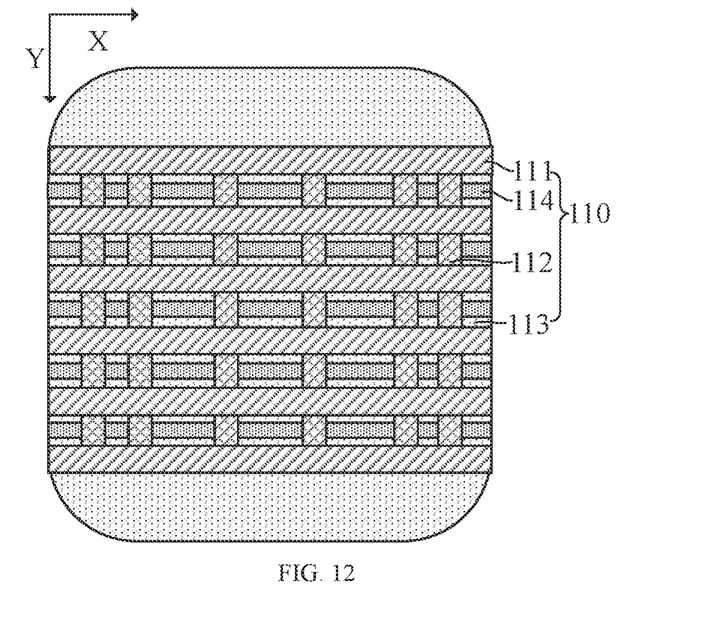
FIG. 12 is another schematic structural diagram of a doped layer in a photovoltaic cell according to an embodiment of the present disclosure.
Figure 13:
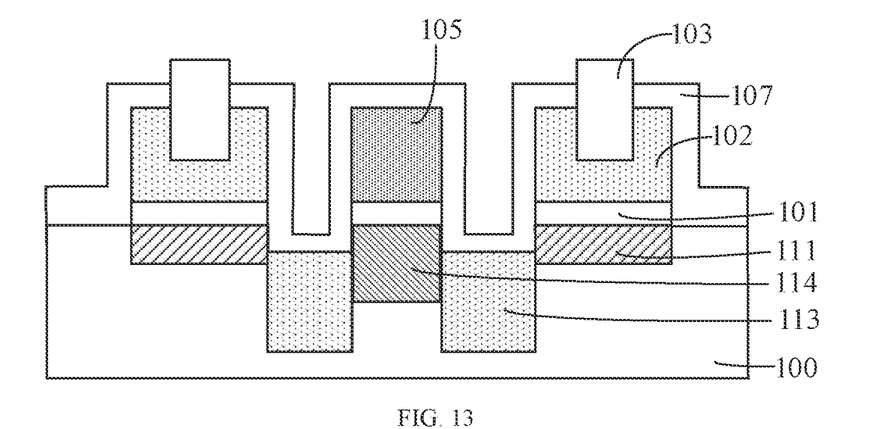
FIG. 13 is still yet another partial and cross-sectional schematic structural diagram of a photovoltaic cell according to an embodiment of the present disclosure.

FIG. 11 is another schematic structural diagram of a photovoltaic cell according to an embodiment of the present disclosure. FIG. 12 is another schematic structural diagram of a doped layer in a photovoltaic cell according to an embodiment of the present disclosure. FIG. 13 is still yet another partial and cross-sectional schematic structural diagram of a photovoltaic cell according to an embodiment of the present disclosure.

In some embodiments, the photovoltaic cell further includes a plurality of second electrodes 106 arranged at intervals along the second direction X. The second electrodes 106 extend along the first direction Y and are electrically connected to the plurality of first electrodes 103 disposed at intervals along the first direction Y for collecting current in the first electrodes 103 for collection and exporting the current from the photovoltaic cell. It should be understood that the second electrodes 106 are in electrical contact not only with the first electrodes 103 but also with partial doped conductive layers 102 so that carriers in the doped conductive layers 102 are able to be directly transmitted into the second electrodes 106 without passing through the first electrodes 103, which improves the ability of the second electrode 106 to collect current.

In some embodiments, at least one conductive transport layer 104 is disposed between two adjacent second electrodes 106, i.e., the second electrodes 106 are interleaved with the conductive transport layers 104. In this way, positions of the second electrodes 106 are limited by the conductive transport layers 104, so that the positions of the second electrodes 106 are determined without performing additional positioning processing during preparing the second electrodes 106, thereby facilitating printing of the second electrodes 106 and simplifying the process flow. The photovoltaic cell further includes a plurality of conductive connection layers 105 each disposed between the conductive transmission layer 104 and the second electrode 106, opposite side walls of the conductive connection layer 105 are in contact with a side wall of the conductive transmission layer 104 and a side wall of the second electrode 106, respectively, so that the second electrode 106 is able to collect the current of the substrate 100 through the doped conductive layer 102 without passing through the first electrode 103. In some embodiments, as shown in FIG. 11, the conductive connection layer 105 may also be disposed between two adjacent conductive transmission layers 104, and the opposite side walls of the conductive connection layer 105 are in contact with a side wall of one of the two adjacent conductive transmission layers 104 and a side wall of the other of the two adjacent conductive transmission layers 104.

In some embodiments, the doped layer 110 further includes a plurality of fourth doped regions 114 each aligned with a respective conductive connection layer 105, and a doping concentration of the fourth doped region is greater than or equal to the doping concentration of the first doped region 111 and less than or equal to the doping concentration of the third doped region 113. The technical effect that the doping concentration of the fourth doping region 114 is greater than or equal to the doping concentration of the first doping region 111 and less than or equal to the doping concentration of the third doping region 113 is similar to the technical effect that the doping concentration of the first doping region 111 is less than the doping concentration of the second doping region 112 and less than the doping concentration of the third doping region 113, which is not repeated herein.

A doping depth of the fourth doped region 114 is greater than or equal to the doping depth of the first doped region 111 and less than or equal to the doping depth of the third doped region 113. The technical effect that the doping depth of the fourth doping region 114 is greater than or equal to the doping depth of the first doping region 111 and less than or equal to the doping depth of the third doping region 113 is similar to the technical effect that the doping depth of the first doping region 111 is less than the doping depth of the second doping region 112 and less than the doping depth of the third doping region 113, which is not repeated herein.

Some embodiments of the present disclosure further provide a photovoltaic module including at least one cell string, each of the at least one cell string formed by a plurality of photovoltaic cells according to the above embodiments which are electrically connected; at least one encapsulation layer, each of the at least one encapsulation layer configured to cover a surface of a respective cell string; and at least one cover plate, each of the at least one cover plate configured to cover a surface of a respective encapsulation layer facing away from the respective cell string.

In the embodiments of the present disclosure, the doped layer 110 is disposed on the surface of the substrate 100, and the doped layer 110 includes the plurality of first doped regions 111, the plurality of second doped regions 112 and the plurality of third doped regions 113. A respective doped conductive layer 102 and a respective first electrode 103 are disposed in each first doped region 111, a respective conductive transport layer 104 is disposed in each second doped region 112, and no first electrode 103 and doped conductive layer 102 is disposed in each third doped region 113. In order to improve the contact between the doped conductive layers 102 and the first electrodes 103, the doped conductive layers 102 are usually configured to be highly doped. In the embodiments of the present disclosure, the doping concentration of each first doped region 111 is less than the doping concentration of each second doped region 112 and less than the doping concentration of each third doped region 113. On the one hand, the decrease of the band gap of the substrate 100 due to the excessive concentration of the doping elements below the first electrode 103 is avoided, so that the reduction of the open-circuit voltage of the photovoltaic cell and the decay of the electric field are avoided. On the other hand, a high doping effect (e.g., a tunneling effect produces a composite current) caused by an excessive doping concentration of the doped conductive layers 102 and the excessive doping concentration of the doped layer 110 is avoided. However, by providing the plurality of second doping regions 112 and the plurality of third doping regions 113 with large doping concentrations, the carrier transporting efficiency in the region unaligned with the first electrodes 103 is improved, so that the open-circuit voltage of the photovoltaic cell is increased, which is conducive to improving the photoelectric conversion efficiency of the photovoltaic cell.

Figure 14:
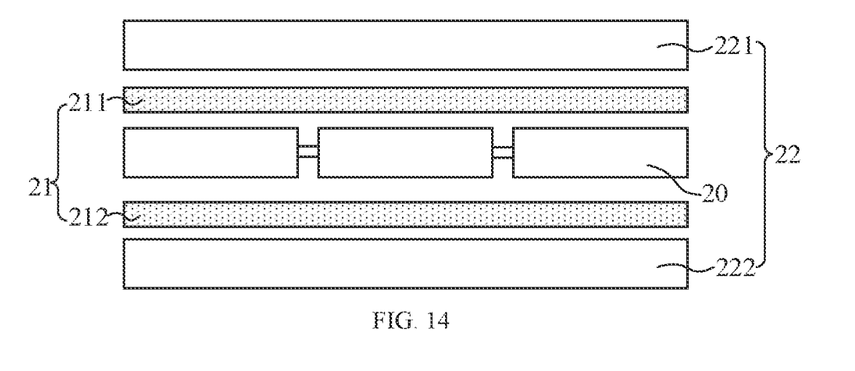
FIG. 14 is a schematic structural diagram of a photovoltaic module according to an embodiment of the present disclosure.

FIG. 14 is a schematic structural diagram of a photovoltaic module according to an embodiment of the present disclosure.

Embodiments of the present disclosure further provides a photovoltaic module. As shown in FIG. 14, the photovoltaic module includes at least one cell string, each of the at least one cell string formed by a plurality of photovoltaic cells 20 according to the above embodiments which are electrically connected; at least one encapsulation layer 21, each of the at least one encapsulation layer 21 configured to cover a surface of a respective cell string; and at least one cover plate 22, each of the at least one cover plate 22 configured to cover a surface of a respective encapsulation layer facing away from the respective cell string. The photovoltaic cells 20 are electrically connected in whole or in pieces to form a plurality of cell strings electrically connected in series and/or in parallel.

Specifically, in some embodiments, the plurality of cell strings may be electrically connected to each other by conductive tapes. The at least one encapsulation layer 21 includes a first encapsulation layer 211 and a second encapsulation layer 212, the first encapsulation layer 211 covers one of the front surface and the rear surface of the photovoltaic cell 20, and the second encapsulation layer 212 covers the other of the front surface and the rear surface of the photovoltaic cell 20. Specifically, at least one of the first encapsulation layer 211 and the second encapsulation layer 212 may be an organic encapsulation adhesive film such as an ethylene-vinyl acetate copolymer (EVA) adhesive film, a polyethylene octene co-elastomer (POE) adhesive film, a polyethylene terephthalate (PET) adhesive film, or the like. In some embodiments, the cover plate 22 may be a glass cover plate, a plastic cover plate, or the like having a light transmitting function. Specifically, the surface of the cover plate 22 facing towards the encapsulation layer 21 may be a concavo-convex surface, thereby increasing utilization of the incident light. The at least one cover plate 22 includes a first cover plate 221 and a second cover plate 222. The first cover plate 221 is with respect to the first encapsulation layer 211, and the second cover plate 222 is with respect to the second encapsulation layer 212.

Although the present disclosure is disclosed in the above embodiments, the present disclosure is not intended to limit the claims. Any person skilled in the art may make several possible changes and modifications without departing from the concept of the present disclosure. Therefore, the protection scope of the present disclosure shall be subject to the scope defined in the claims of the present disclosure. In addition, the embodiments and the accompanying drawings of the present disclosure are illustrative only and are not the full protection scope of the claims.

Those of ordinary skill in the art should appreciate that the embodiments described above are specific embodiments of the present disclosure, and in practical application, various changes may be made thereto in form and detail without departing from the spirit and scope of the present disclosure. Any person skilled in the art may make his or her own changes and modifications without departing from the spirit and scope of the present disclosure. Therefore, the protection scope of the present disclosure shall be subject to the scope limited by the claims.

What is claimed is:

1. A photovoltaic cell comprising:
    a substrate;
    a doped layer disposed in a portion of the substrate adjacent to a first surface of the substrate, wherein a doping element type of the doped layer is the same as a doping element type of the substrate, and a doping concentration of the doped layer is greater than a doping concentration of the substrate, wherein the doped layer includes a plurality of first doped regions arranged at intervals along a first direction, a plurality of second doped regions disposed between respective two adjacent first doped regions and a plurality of third doped regions disposed between the respective two adjacent first doped regions, and wherein a doping concentration of each of the plurality of first doped regions is less than a doping concentration of any of the plurality of second doped regions and less than a doping concentration of any of the plurality of third doped regions;
    at least one tunneling dielectric layer disposed on the plurality of first doped regions and the plurality of second doped regions;
    a plurality of doped conductive layers arranged at intervals along the first direction, wherein each of the plurality of doped conductive layers is aligned with a respective first doped region and is disposed on a respective tunneling dielectric layer;
    a plurality of first electrodes arranged at intervals along the first direction, wherein the plurality of first electrodes extend in a second direction, each of the plurality of first electrodes is disposed on a side of a respective doped conductive layer away from the substrate and electrically connected to the respective doped conductive layer; and
    a plurality of conductive transport layers each aligned with a respective second doped region, wherein the plurality of conductive transport layers are disposed on the at least one tunneling dielectric layer, and each of the plurality of conductive transport layers is disposed between respective two adjacent doped conductive layers of the plurality of doped conductive layers and is in contact with side walls of the respective two adjacent doped conductive layers;
    wherein a doping element type of each of the plurality of doped conductive layers is the same as the doping element type of the doped layer, and the doping concentration of the doped layer is less than a doping concentration of each of the plurality of doped conductive layers.

2. The photovoltaic cell according to claim 1, wherein a doping concentration of each of the plurality of second doping regions is less than or equal to a doping concentration of each of the plurality of third doping regions.

3. The photovoltaic cell according to claim 1, wherein a doping depth of each of the plurality of first doped regions is less than a doping depth of each of the plurality of second doped regions in a direction perpendicular to the first surface.

4. The photovoltaic cell according to claim 1, wherein a doping depth of each of the plurality of second doping regions is less than or equal to a doping depth of each of the plurality of third doping regions in a direction perpendicular to the first surface.

5. The photovoltaic cell according to claim 1, wherein a doping depth of each of the plurality of first doped regions is in a range of 30 nm to 300 nm, a doping depth of each of the plurality of second doping regions is in a range of 50 nm to 500 nm, and a doping depth of each of the plurality of third doping regions is in a range of 200 nm to 1500 nm.

6. The photovoltaic cell according to claim 1, wherein the doping concentration of each of the plurality of first doped regions is in a range of 5E19 cm-3 to 1E21 cm-3, the doping concentration of each of the plurality of second doped regions is in a range of 1E20 cm-3 to 3E21 cm-3, and the doping concentration of each of the plurality of third doped regions is in a range of 5E17 cm-3 to 1E20 cm-3.

7. The photovoltaic cell according to claim 1, wherein a total doping amount of the plurality of first doped regions is less than a total doping amount of the plurality of second doped regions and less than a total doping amount of the plurality of third doped regions.

8. The photovoltaic cell according to claim 1, wherein a doping element type of each of the plurality of conductive transport layers is the same as the doping element type of the doped layer, and a doping concentration of each of the plurality of conductive transport layers is greater than the doping concentration of the doped layer.

9. The photovoltaic cell according to claim 8, wherein each of the plurality of conductive transport layers includes body portions arranged at intervals along the first direction and a connection portion between the body portions, and wherein the body portions are in contact with side walls of the respective two adjacent doped conductive layers, and a doping concentration of each of the body portions is less than or equal to a doping concentration of the connection portion.

10. The photovoltaic cell according to claim 9, wherein each of the plurality of second doping regions includes first sub-doping portions and a second sub-doping portion, and wherein each of the first sub-doping portions is aligned with a respective body portion, the second sub-doping portion is aligned with the connection portion, and a doping concentration of each of the first sub-doping portions is less than or equal to a doping concentration of the second sub-doping portion.

11. The photovoltaic cell according to claim 10, wherein a doping depth of each of the first sub-doping portions is less than or equal to a doping depth of the second sub-doping portion in a direction perpendicular to the first surface.

12. The photovoltaic cell according to claim 9, wherein a ratio of a total area of connection portions in the plurality of conductive transport layers to a total area of the plurality of conductive transport layers is in a range of 1:11 to 2:3.

13. The photovoltaic cell according to claim 1, wherein a material of the doped layer includes at least one of single crystal silicon, microcrystal silicon, amorphous silicon and polysilicon.

14. The photovoltaic cell according to claim 13, wherein the material of the doped layer is the same as at least one of a material of the substrate, a material of each of the plurality of doped conductive layers, and a material of each of the plurality of conductive transport layers.

15. The photovoltaic cell according to claim 1, further comprising a passivation layer disposed on the plurality of doped conductive layers, the plurality of conductive transport layers, and the plurality of third doped regions.

16. The photovoltaic cell according to claim 1, further comprising a plurality of second electrodes arranged at intervals along the second direction, wherein the plurality of second electrodes extend along the first direction and are electrically connected to the plurality of first electrodes arranged at intervals along the first direction.

17. The photovoltaic cell according to claim 16, wherein at least one conductive transport layer is disposed between two adjacent second electrodes, and the photovoltaic cell further comprises a plurality of conductive connection layers each disposed between a respective conductive transport layer and a respective second electrode, opposite side walls of each of the plurality of conductive connection layers are respectively in contact with a side wall of the respective conductive transport layer and a side wall of the respective second electrode.

18. The photovoltaic cell according to claim 17, wherein the doped layer further includes a plurality of fourth doped regions each aligned with a respective conductive connection layer, and a doping concentration of each of the plurality of fourth doped regions is greater than or equal to a doping concentration of each of the plurality of first doped regions and less than or equal to a doping concentration of each of the plurality of third doped regions.

19. A photovoltaic module comprising:
   at least one cell string, wherein each of the at least one cell string is formed by a plurality of photovoltaic cells electrically connected;
   at least one encapsulation layer, wherein each of the at least one encapsulation layer is configured to cover a surface of a respective cell string; and
   at least one cover plate, wherein each of the at least one cover plate is configured to cover a surface of a respective encapsulation layer facing away from the respective cell string;
   wherein each of the plurality of photovoltaic cells includes:
   a substrate;
   a doped layer disposed in a portion of the substrate adjacent to a first surface of the substrate, wherein a doping element type of the doped layer is the same as a doping element type of the substrate, and a doping concentration of the doped layer is greater than a doping concentration of the substrate, wherein the doped layer includes a plurality of first doped regions arranged at intervals along a first direction, a plurality of second doped regions disposed between respective two adjacent first doped regions and a plurality of third doped regions disposed between the respective two adjacent first doped regions, and wherein a doping concentration of each of the plurality of first doped regions is less than a doping concentration of any of the plurality of second doped regions and less than a doping concentration of any of the plurality of third doped regions;
   at least one tunneling dielectric layer disposed on the plurality of first doped regions and the plurality of second doped regions;

a plurality of doped conductive layers arranged at intervals along the first direction, wherein each of the plurality of doped conductive layers is aligned with a respective first doped region and is disposed on a respective tunneling dielectric layer;
a plurality of first electrodes arranged at intervals along the first direction, wherein the plurality of first electrodes extend in a second direction, each of the plurality of first electrodes is disposed on a side of a respective doped conductive layer away from the substrate and electrically connected to the respective doped conductive layer; and
a plurality of conductive transport layers each aligned with a respective second doped region, wherein the plurality of conductive transport layers are disposed on the at least one tunneling dielectric layer, and each of the plurality of conductive transport layers is disposed between respective two adjacent doped conductive layers of the plurality of doped conductive layers and is in contact with side walls of the respective two adjacent doped conductive layers;
wherein a doping element type of each of the plurality of doped conductive layers is the same as the doping element type of the doped layer, and the doping concentration of the doped layer is less than a doping concentration of each of the plurality of doped conductive layers.

* * * * *